United States Patent [19]
Sandhu

[11] Patent Number: 5,229,659
[45] Date of Patent: Jul. 20, 1993

[54] LOW POWER COMPLEMENTARY MOSFET DIGITAL SIGNAL BUFFER CIRCUIT

[75] Inventor: Bal S. Sandhu, Fremont, Calif.

[73] Assignee: National Semiconductor Corporation, Santa Clara, Calif.

[21] Appl. No.: 777,586

[22] Filed: Oct. 16, 1991

[51] Int. Cl.[5] ............................................ H03K 19/20
[52] U.S. Cl. .................................... 307/451; 307/448; 307/296.5
[58] Field of Search ...................... 307/448, 451, 296.5, 307/475

[56] References Cited

U.S. PATENT DOCUMENTS

| | | | |
|---|---|---|---|
| 4,347,447 | 8/1982 | Proebsting | 307/448 |
| 4,724,342 | 2/1988 | Sato | 307/448 |
| 4,808,852 | 2/1989 | Kousaka | 307/451 |
| 5,087,841 | 2/1992 | Rogers | 307/451 |
| 5,115,434 | 5/1992 | Aizaki | 307/451 |

Primary Examiner—Edward P. Westin
Assistant Examiner—Andrew Sanders
Attorney, Agent, or Firm—Limbach & Limbach

[57] ABSTRACT

A low power complementary MOSFET buffer circuit includes an input complementary MOSFET inverter with a plurality of serially coupled diode-connected complementary MOSFETs and an output complementary MOSFET inverter. An input digital signal drives one of the input inverter's MOSFET gates, and passes through the diode-connected MOSFETs to be biased, or level-shifted, prior to driving the input inverter's other MOSFET gate. Driving the input inverter's MOSFET gates with both the input digital signal directly and its biased equivalent ensures that, when each of the input inverter's MOSFETs is turned "off" in accordance with the logic level of the input digital signal, it is turned off more fully, thereby minimizing power dissipation. The inverted digital signal outputted from the input inverter drives both of the output inverter's MOSFET gates. The original input digital signal also drives one of the output inverter's MOSFET sources, whereby the low-to-high transition time of the output digital signal is reduced.

17 Claims, 3 Drawing Sheets

LOW POWER COMPLEMENTARY MOSFET DIGITAL SIGNAL BUFFER CIRCUIT

BACKGROUND OF THE INVENTION

1. Field of the Invention

The present invention relates to digital signal buffer circuits, and in particular, to digital signal buffer circuits employing complementary metal oxide semiconductor field effect transistors ("MOSFETs") for minimizing power consumption.

2. Description of the Related Art

Digital signal buffer circuits are commonly used for such purposes as signal or circuit isolation, impedance matching, or improvement of fan-in and fan-out characteristics. A common type of buffer circuit design is an inverter. A conventional inverter design 10 using complementary MOSFETs is shown in FIG. 1. The P-type MOSFET ("P-MOSFET") 12 and N-type MOSFET ("N-MOSFET") 14 are mutually coupled in a totem-pole configuration in which their gates 12g, 14g and drains 12d, 14d are connected to receive the input signal 16 to be buffered and provide the complementary output buffered signal 18, respectively.

The source 12s of the P-MOSFET 12 is connected to a positive voltage supply VDD and the source 14s of the N-MOSFET 14 is connected to a negative voltage supply VSS. Alternatively, if dual power supplies are not to be used, and instead a single positive power supply is to be used, the source 12s of the P-MOSFET 12 is connected to a positive voltage supply VCC and the source 14s of the N-MOSFET 14 is connected to the circuit reference, or ground GND.

The buffer circuit 10 of FIG. 1 consumes relatively low power due to its use of complementary MOSFETs 12, 14. However, its power consumption becomes more significant when it is used for buffering a transistor-transistor logic ("TTL") type of input signal 16 (with a VCC-GND power supply configuration). A TTL "0", or logical low, is very close to zero volts, but a TTL "1", or logical high, is generally far below the value of the positive supply voltage VCC. While VCC is typically equal to 5 volts, a TTL "1" is typically between 2 and 2.5 volts. Thus, although the application of a TTL "0" as the input signal 16 will generally turn the N-MOSFET 14 virtually completely off and the P-MOSFET 12 virtually completely on, a typical TTL "1" will not reliably turn the N-MOSFET 14 completely on or the P-MOSFET 12 completely off. Accordingly, when the input signal 16 is a TTL "1", the output signal 18 will be a TTL "0"; however, the buffer circuit 10 will still be dissipatinq DC power since the P-MOSFET 12 will not be completely turned off, and will therefore be conducting current to the N-MOSFET 14 which has been turned on.

Referring below to Tables 1A and 1B, typical supply (drain) currents for the MOSFETs 12, 14 (with channel widths and lengths as indicated) for the conventional buffer circuit 10 are shown for various VCC voltages and ambient temperatures. (Table 1A also includes representative worst case propagation delays for a full IC simulation including additional circuitry external to the buffer circuit 10.) It can be seen that a significant amount of supply current flows with the input signal 16 voltage equal to a typical TTL "1" level of two volts. Reductions in supply current are possible by properly scaling down the channels of the MOSFETs 12, 14, but at a cost of increased propagation delay.

TABLE 1A

CONVENTIONAL BUFFER CIRCUIT

| MOSFET Type | Channel Width | Channel Length |
|---|---|---|
| P | 43 microns | 3.0 microns |
| N | 150 microns | 2.6 microns |

| VCC = 4.75 volts dc; Temperature = 55° C. | |
|---|---|
| Input (volts) | Current (micro-amperes) |
| 2 | 1406.0 |
| 3 | 422.9 |

| Input | Output | Delay (nanoseconds) | | |
|---|---|---|---|---|
| L$_I$→H$_I$ | H$_O$→L$_O$ | 7.02 | where: | H$_I$ = 3 volts |
| H$_I$→L$_I$ | L$_O$→H$_O$ | 6.80 | | L$_I$ = 0 volts |

TABLE 1B

CONVENTIONAL BUFFER CIRCUIT

| MOSFET Type | Channel Width | Channel Length |
|---|---|---|
| P | 43 microns | 3.0 microns |
| N | 150 microns | 2.6 microns |

| VCC = 5.25 volts dc; Temperature = 27° C. | |
|---|---|
| Input (volts) | Current (micro-amperes) |
| 2 | 2163.0 |
| 3 | 899.1 |

| VCC = 5.25 volts dc; Temperature = 0° C. | |
|---|---|
| Input (volts) | Current (micro-amperes) |
| 2 | 2292.0 |
| 3 | 922.3 |

Referring below to Table 2, it can be seen that with the channel widths for the P-MOSFET 12 and N-MOSFET 14 reduced to 8 and 28 microns, respectively, and the input signal 16 voltage at two volts, the total MOSFET drain current can be substantially reduced. However, it can been seen by comparing Tables 1 and 2 that the propagation delay also increases substantially. Thus, while scaling down the MOSFET geometries can substantially reduce the total drain current, a concomitant penalty is paid with respect to propagation delay.

TABLE 2

CONVENTIONAL "LOW POWER" BUFFER CIRCUIT

| MOSFET Type | Channel Width | Channel Length |
|---|---|---|
| P | 8 microns | 3.0 microns |
| N | 28 microns | 2.6 microns |

| VCC = 4.75 volts dc; Temperature = 55° C. | |
|---|---|
| Input (volts) | Current (micro-amperes) |
| 2 | 268.50 |
| 3 | 80.16 |

| Input | Output | Delay (nanoseconds) | | |
|---|---|---|---|---|
| L$_I$→H$_I$ | H$_O$→L$_O$ | 7.63 | where: | H$_I$ = 3 volts |
| H$_I$→L$_I$ | L$_O$→H$_O$ | 8.15 | | L$_I$ = 0 volts |

SUMMARY OF THE INVENTION

A low power complementary MOSFET digital signal buffer circuit in accordance with the present invention includes a first complementary MOSFET inverter for receiving an input digital signal and a biased input digital signal to provide therefrom a first inverted digital signal. Also included is a signal biasing circuit for also receiving the input digital signal and providing therefrom the biased input digital signal for the first complementary MOSFET inverter. In a preferred embodiment of the present invention, further included is a second complementary MOSFET inverter for also receiving the input digital signal and for receiving the first inverted digital signal, and for providing therefrom a second inverted digital signal.

In accordance with the present invention, application of both the input digital signal and its biased signal equivalent ensures that each of the complementary MOSFETs is turned more fully on or turned more fully off in accordance with the input signal level, thereby minimizing MOSFET drain current.

These and other objectives, features and advantages of the present invention will be understood upon consideration of the following detailed description of the invention and the accompanying drawings.

DETAILED DESCRIPTION OF THE INVENTION

Figure 2:
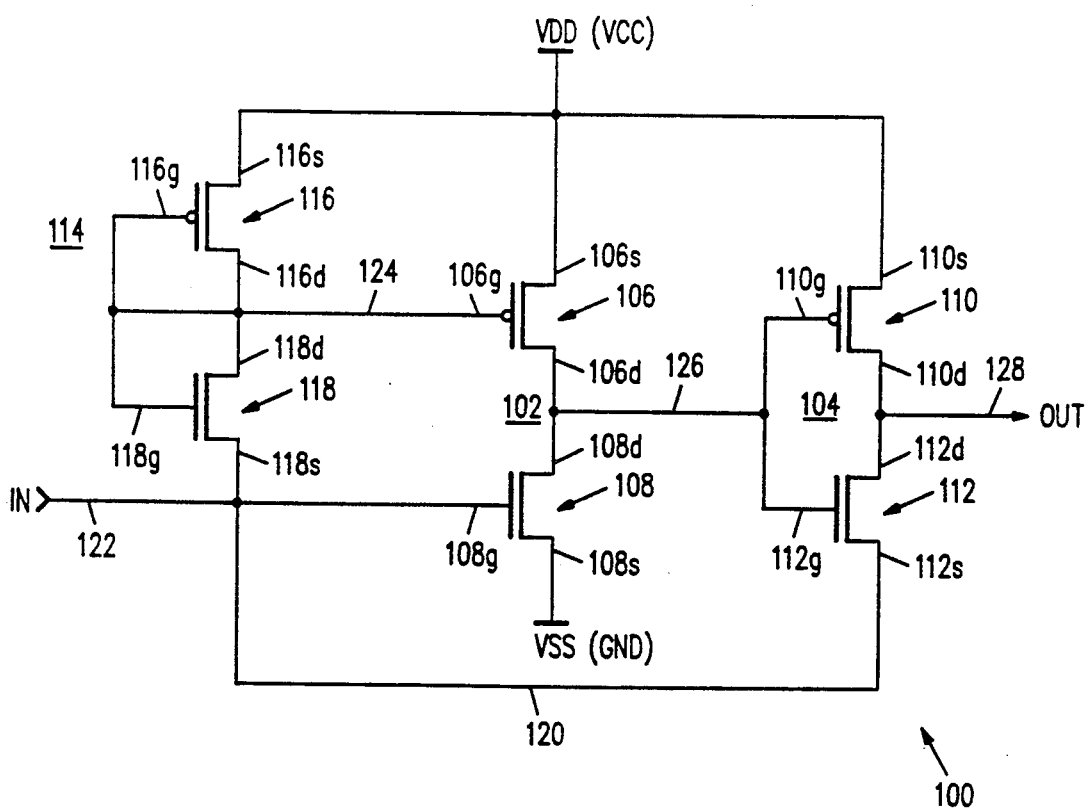
FIG. 2 illustrates a schematic diagram of a preferred embodiment of a low power complementary MOSFET digital signal buffer circuit in accordance with the present invention.

Referring to FIG. 2, a low power complementary MOSFET digital signal buffer circuit 100 in accordance with the present invention includes two MOSFET inverter circuits 102, 104 and a MOSFET diode circuit 114 used as an input signal biasing circuit (discussed further below), connected substantially as shown. The first inverter circuit 102 includes a P-MOSFET 106 and an N-MOSFET 108 mutually coupled in a totem-pole configuration. Power supply connections are conventional in that the positive power supply VDD biases the source 106s of the P-MOSFET 106 and the negative power supply VSS biases the source 108s of the N-MOSFET 108. In a preferred embodiment of the present invention, the positive power supply VDD is typically approximately five volts (e.g. a TTL power supply VCC), and the negative power supply VSS is the circuit reference potential, or ground GND.

The second inverter 104 includes a P-MOSFET 110 and an N-MOSFET 112 mutually coupled in a totem-pole configuration. Their gates 110g and 112g are mutually coupled, as are their drains 110d, 112d. The source 110s of the P-MOSFET 110 is biased by the positive power supply VDD. However, the source 112s of the N-MOSFET 112 is not biased by the negative power supply VSS, but instead is connected to receive the input signal 122 directly (discussed further below) via a connecting signal path 120.

The MOSFET diode circuit 114 includes a P-MOSFET 116 and an N-MOSFET 118 in a diode-connected configuration, as shown. Their gates 116g, 118g and drains 116d, 118d are all mutually coupled, thereby rendering the MOSFETs 116, 118 substantially electrically equivalent to diodes. The source 118s of the N-MOSFET 118 is coupled to the gate 108g of the N-MOSFET 108 of the first inverter 102, and to the source 112s of the N-MOSFET 112 of the second inverter 104 via the connecting signal path 120.

An input digital signal (e.g. a TTL signal) 122 is inputted to the MOSFET diode circuit 114, the N-MOSFET 108 of the first inverter 102, and the N-MOSFET 112 of the second inverter 104. The MOSFET diode circuit 114 biases this input signal 122 to generate a biased input signal 124 at the gate 106g of the P-MOSFET 106 of the first inverter 102. The first inverter 102 provides a first inverted signal 126 to the second inverter 104, which in turn, provides a second inverted signal 128 as the output signal.

With the input signal 122 at a TTL "0", i.e. approximately zero volts, the N-MOSFET 108 of the first inverter 102 is turned off and the P-MOSFET 106 is turned on, thereby causing the node coupling their drains 106d, 108d to charge toward VCC. The P-MOSFET 106 is turned on because its gate 106g sits at approximately 1.8 volts, i.e. the sum of the P- and N-channel thresholds of the diode-connected P-MOSFET 116 and N-MOSFET 118, respectively. This means that the mutually coupled gates 110g, 112g of the second inverter 104 are charged toward a VCC potential, thereby turning the second inverter's P-MOSFET 110 off and N-MOSFET 112 on, further thereby causing the output signal 128 to become a TTL "0", i.e. approximately zero volts.

As the input signal 122 transitions from a TTL 37 0" to a TTL "1", i.e. approximately from zero volts to two volts, the first inverter's N-MOSFET 108 begins turning on, thereby pulling its drain 108d potential down. Also, the biased input signal 124 begins rising, following the transition of the input signal 122, thereby causing the first P-MOSFET 106 to begin turning off because its gate-to-source bias begins falling.

The falling potential at the drain 108d of the first inverter's N-MOSFET 108 causes the potential at the gate 112g of the second inverter's N-MOSFET 112 (i.e. the first inverted signal 126 level) to fall, thereby driving the second inverter's N-MOSFET 112 into its cut-off region. However, the input signal 122 is rising faster, i.e. sooner, than the potential is falling at the gate 112g of the second inverter's N-MOSFET 112. Therefore, during the initial transition of the input signal 122, the input signal, applied to the source 112s of the second inverter's N-MOSFET 112 via the connecting signal path 120, passes to the drain 112d of the second inverter's N-passes MOSFET 112, and therefore provides the initial transition of the output signal 128. As the first inverted signal 126 continues falling to zero volts, the second P-MOSFET 110 turns on, causing the output signal 128 to rise toward VCC.

Conversely, when the input signal 122 transitions from a TTL "1" to a TTL "0", i.e. approximately from two volts to zero volts, the first inverter's N-MOSFET 108 turns off, and the first inverter's P-MOSFET 106 turns on due to the downward transition of the biased input signal 124 to approximately 1.8 volts, i.e. the sum of the P-channel and N-channel thresholds of the diode-connected P-MOSFET 116 and N-MOSFET 118. This causes the first inverted signal 126 to rise to approximately VCC, thereby turning the second inverter's N-MOSFET 112 on and P-MOSFET 110 off, and the output signal 128 to fall to a TTL "0".

Thus, using the diode-connected MOSFETs 116, 118 to produce a biased input signal 124 with a higher "high" logic voltage level than the original input signal 122, the first inverter's p-MOSFET 106 can be turned off more fully, thereby substantially reducing the drain current through the first inverter 102. Further, by coupling the input signal 122 directly to the second, or output, inverter 104 via the connecting signal path 120, input-to-output signal propagation delay is minimized.

This can be more fully appreciated by referring to Tables 3A and 3B below. Under the same conditions (e.g. MOSFET channel widths and lengths, power supply voltage, ambient temperature and input signal voltage levels) as for the conventional buffer circuit 10 of FIG. 1 (Tables 1A and 1B), the total supply (drain) current for both inverters 102, 104 is substantially less than that for the conventional buffer circuit 10 of FIG. 1. Further, the corresponding full IC simulation propagation delay of the circuit of FIG. 2 suffers a degradation of, at most, only approximately one nanosecond.

TABLE 3A

BUFFER CIRCUIT INVENTION

| MOSFET (Type) | Channel Width | Channel Length |
|---|---|---|
| 106 (P) | 15 microns | 3 microns |
| 108 (N) | 7 microns | 3 microns |
| 110 (P) | 8 microns | 2.5 microns |
| 112 (N) | 25 microns | 2.5 microns |
| 116 (P) | 3 microns | 3 microns |
| 118 (N) | 3 microns | 6 microns |

VCC = 4.75 volts dc; Temperature = 55° C.

| Input (volts) | Current (micro-amperes) |
|---|---|
| 2 | 90.68 |
| 3 | 12.47 |

| Input | Output | Delay (nanoseconds) | |
|---|---|---|---|
| $L_I \to H_I$ | $H_O \to L_O$ | 7.16 | where: $H_I = 3$ volts |
| $H_I \to L_I$ | $L_O \to H_O$ | 7.75 | $L_I = 0$ volts |

TABLE 3B

BUFFER CIRCUIT INVENTION

| MOSFET (Type) | Channel Width | Channel Length |
|---|---|---|
| 106 (P) | 15 microns | 3 microns |
| 108 (N) | 7 microns | 3 microns |
| 110 (P) | 8 microns | 2.5 microns |
| 112 (N) | 25 microns | 2.5 microns |
| 116 (P) | 3 microns | 3 microns |
| 118 (N) | 3 microns | 6 microns |

VCC = 5.25 volts dc; Temperature = 27° C.

| Input (volts) | Current (micro-amperes) |
|---|---|
| 2 | 191.80 |
| 3 | 41.17 |

VCC = 5.25 volts dc; Temperature = 0° C.

| Input (volts) | Current (micro-amperes) |
|---|---|
| 2 | 187.20 |
| 3 | 34.57 |

Figure 1:
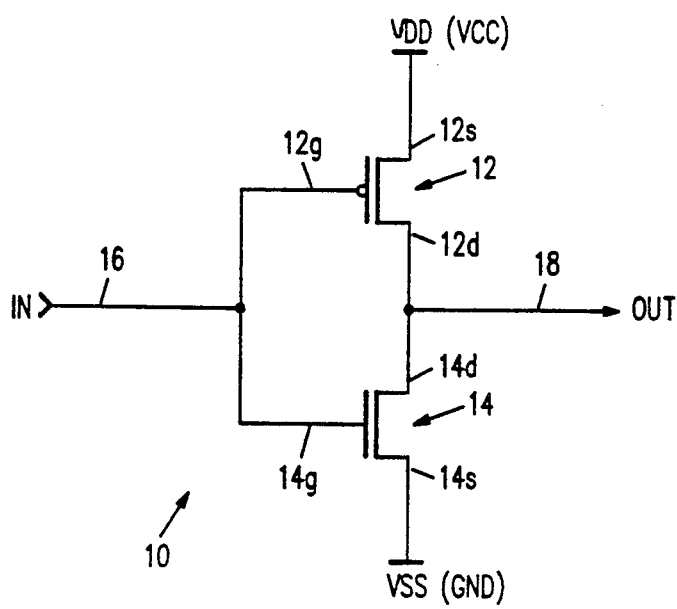
FIG. 1 illustrates a schematic diagram of a conventional complementary MOSFET inverter circuit.
Figure 3:
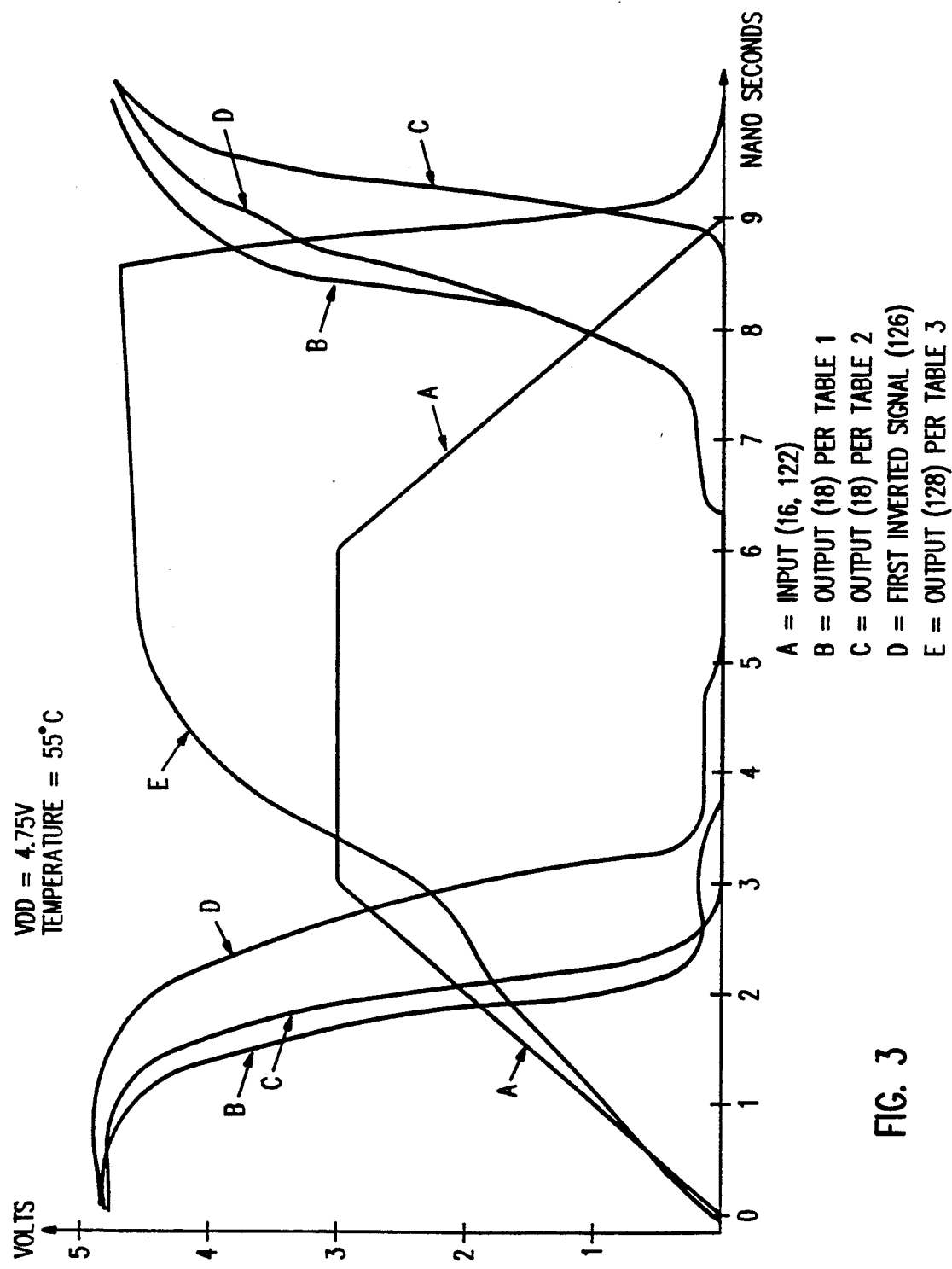
FIG. 3 illustrates a composite signal timing diagram for the input and output signals of the circuit of FIG. 2.

Referring to FIG. 3, the propagation delays of the circuits of FIGS. 1 and 2 can be compared graphically. Signal plot A represents the input signals 16, 122. Signal plot B represents transitions of the output signal 18 for the conventional buffer circuit 10 of FIG. 1, with the device parameters of Tables 1A-1B and 2A-2B, respectively. Signal plot D represents the first inverted signal 126 of FIG. 2. Signal plot E represents the output signal 128 of FIG. 2.

Figure 4:
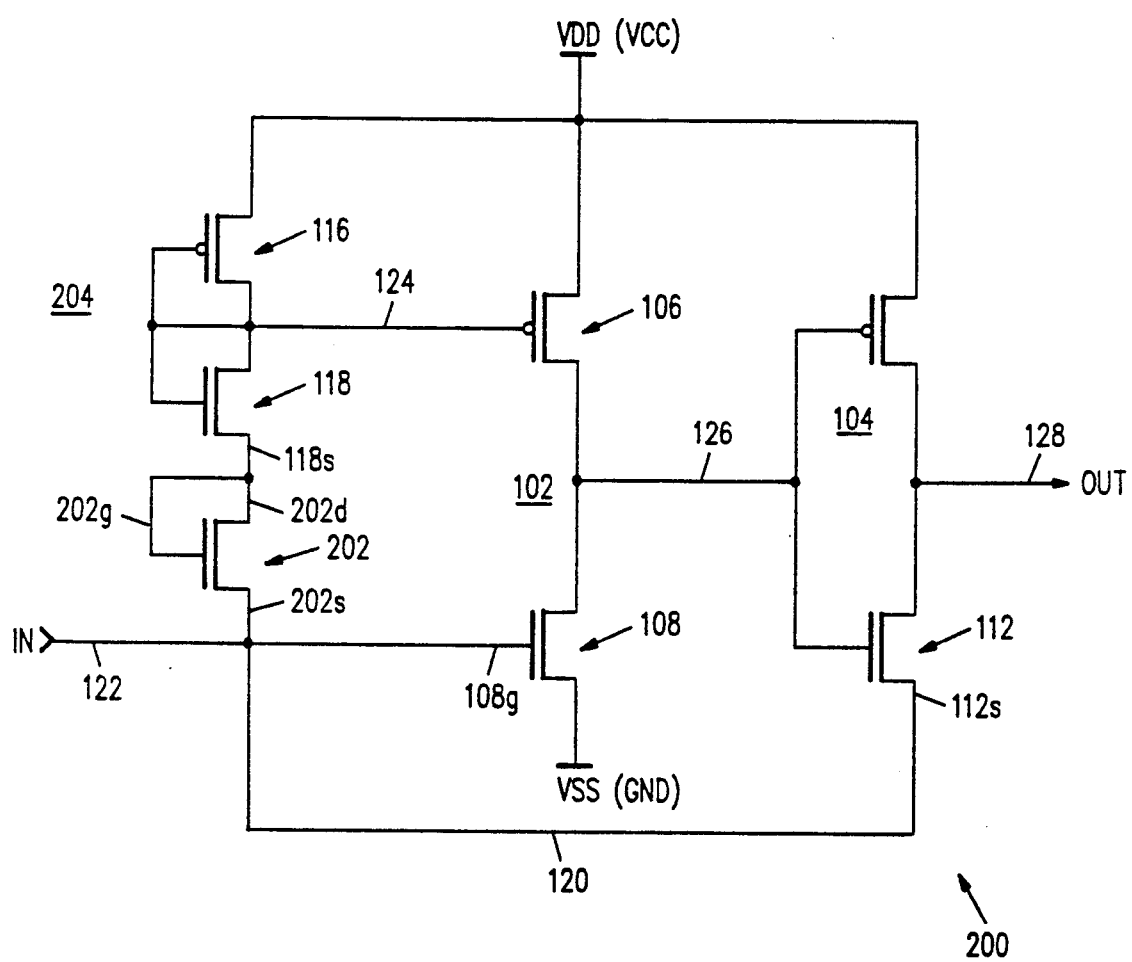
FIG. 4 illustrates a schematic diagram of an alternative embodiment of a low power complementary MOSFET digital signal buffer circuit in accordance with the present invention.

Referring to FIG. 4, an alternative embodiment of a buffer circuit 200 in accordance with the present invention is shown in which a MOSFET diode circuit 204 having an additional diode-connected MOSFET 202 is used. This additional diode-connected MOSFET 202 is connected in series with the original diode-connected MOSFETs 116, 118. Its gate 202g and drain 202d are coupled together and to the source 118s of the diode-connected N-MOSFET 118. Its source 202s is connected to the gate 108g of the first inverter's N-MOSFET 108 and the signal path 120 connecting the input signal 122 to the source 112s of the second inverter's N-MOSFET 112. This results in a MOSFET diode circuit 204 which biases the input signal 122 positively by an additional N-channel threshold voltage, i.e. the N-channel threshold voltage of the additional N-MOSFET 202. This makes the biased input signal 124 even more positive, thereby turning the first inverter's P-MOSFET 106 off even more fully when the input signal 122 is at a TTL "1". This causes the first inverter's MOSFET drain currents to be reduced even further. However, the propagation delay of the circuit 200 of FIG. 4 suffers a significant degradation. This can be better appreciated by referring to Table 4 below and comparing the current and propagation delays with their counterparts in Tables 3A and 3B above.

TABLE 4

BUFFER CIRCUIT INVENTION (W/EXTRA "DIODE")

| MOSFET (Type) | Channel Width | Channel Length |
|---|---|---|
| 106 (P) | 15 microns | 3 mcirons |
| 108 (N) | 7 microns | 3 microns |
| 110 (P) | 8 microns | 2.5 microns |
| 112 (N) | 25 microns | 2.5 microns |
| 116 (P) | 3 microns | 3 microns |
| 118 (N) | 3 microns | 6 microns |
| 202 (N) | 3 microns | 6 microns |

VCC = 4.75 volts dc; Temperature = 55° C.

| Input (volts) | Current (micro-amperes) |
|---|---|
| 2 | 37.09 |
| 3 | 4.17 |

| Input | Output | Delay (nanoseconds) | |
|---|---|---|---|
| $L_I \to H_I$ | $H_O \to L_O$ | 7.15 | where: $H_I = 3$ volts |
| $H_I \to L_I$ | $L_O \to H_O$ | 8.80 | $L_I = 0$ volts |

It should be understood that various alternatives to the embodiments of the present invention described herein can be employed in practicing the present invention. It is intended that the following claims define the scope of the present invention, and that structures and methods within the scope of these claims and their equivalents be covered thereby.

What is claimed is:

1. An improved complementary MOSFET buffer circuit including a first complementary MOSFET inverter comprising first and second complementary MOSFETs with, respectively, first and second MOSFET sources, mutually coupled first and second MOSFET gates for receiving a first digital signal, and mutually coupled first and second MOSFET drains for providing an output digital signal, wherein the improvement comprises:

a second complementary MOSFET inverter comprising third and fourth complementary MOSFETs which are mutually coupled in a totem-pole topology and have, respectively, third and fourth MOSFET gates for receiving an input digital signal and a second digital signal, respectively, and mutually coupled third and fourth MOSFET drains coupled to said mutually coupled first and second MOSFET gates; and a plurality of diode-connected MOSFETs coupled serially between said third and fourth MOSFET gates for receiving said input digital signal and providing said second digital signal to said fourth MOSFET gate.

2. An improved complementary MOSFET buffer circuit as recited in claim 1, wherein said improvement further comprises coupling means for coupling said third MOSFET gate to said first MOSFET source.

3. A complementary MOSFET buffer circuit for receiving and buffering a digital signal, said complementary MOSFET buffer circuit comprising:

first complementary MOSFET inverter means for receiving an input digital signal and a biased input digital signal, and for providing a first inverted digital signal; and signal biasing means for receiving said input digital signal via a MOSFET channel and providing said biased input digital signal.

4. A complementary MOSFET buffer circuit as recited in claim 3, wherein said first complementary MOSFET inverter means comprises first and second complementary MOSFETs which are mutually coupled in a totem-pole topology and have, respectively, first and second MOSFET gates for receiving said input digital signal and said biased input digital signal, respectively, and mutually coupled first and second MOSFET drains for providing said first inverted digital signal.

5. A complementary MOSFET buffer circuit as recited in claim 3, wherein said signal biasing means comprises a plurality of diode-connected MOSFETs.

6. A complementary MOSFET buffer circuit as recited in claim 3, further comprising second complementary MOSFET inverter means for receiving said first inverted digital signal and for providing a second inverted digital signal.

7. A complementary MOSFET buffer circuit as recited in claim 6, wherein said second complementary MOSFET inverter means comprises third and fourth complementary MOSFETs which are mutually coupled in a totem-pole topology and have, respectively, mutually coupled third and fourth MOSFET gates for receiving said first inverted digital signal, and mutually coupled third and fourth MOSFET drains for providing said second inverted digital signal.

8. A complementary MOSFET buffer circuit for receiving and buffering a digital signal, said complementary MOSFET buffer circuit comprising:

input-biased complementary MOSFET input inverter means for receiving and biasing an input digital signal, and for providing a first inverted digital signal, wherein said input digital signal is received via a MOSFET channel and a MOSFET gate; and input-coupled complementary MOSFET output inverter means for receiving said first inverted digital signal and said input digital signal, and for providing a second inverted digital signal.

9. A complementary MOSFET buffer circuit as recited in claim 8, wherein said input-coupled complementary MOSFET output inverter means comprises third and fourth complementary MOSFETs which are mutually coupled in a totem-pole topology and have, respectively, mutually coupled third and fourth MOSFET gates for receiving said first inverted digital signal, a third MOSFET source for receiving said input digital signal and a fourth MOSFET source, and third and fourth mutually coupled MOSFET drains for providing said second inverted digital signal.

10. A digital signal buffering method for receiving and buffering a digital signal, comprising the steps of:

receiving an input digital signal via a MOSFET channel;

biasing said received input digital signal to provide a biased input digital signal; and inputting said input digital signal and said biased input digital signal to a first complementary MOSFET inverter to provide a first inverted digital signal.

11. A digital signal buffering method as recited in claim 10, wherein said step of biasing said received input digital signal to provide a biased input digital signal comprises inputting said received input digital signal to a plurality of diode-connected MOSFETs and outputting therefrom said biased input digital signal.

12. A digital signal buffering method as recited in claim 10, wherein said step of inputting said input digital signal and said biased input digital signal to a first complementary MOSFET inverter to provide a first inverted digital signal comprises:

inputting said input digital signal to a first MOSFET gate;

inputting said biased input digital signal to a second MOSFET gate; and outputting said first inverted digital signal from mutually coupled first and second MOSFET drains.

13. A complementary MOSFET buffer circuit for receiving and buffering a digital signal, said complementary MOSFET buffer circuit comprising:

first complementary MOSFET inverter means for receiving an input digital signal and a biased input digital signal, and for providing a first inverted digital signal;

signal biasing means for receiving said input digital signal and providing said biased input digital signal; and second complementary MOSFET inverter means for receiving said input digital signal and said first inverted digital signal, and for providing a second inverted digital signal.

14. A complementary MOSFET buffer circuit as recited in claim 13, wherein said second complementary MOSFET inverter means comprises third and fourth complementary MOSFETs which are mutually coupled in a totem-pole topology and have, respectively, a third MOSFET source for receiving said input digital signal and a fourth MOSFET source, third and fourth mutually coupled MOSFET gates for receiving said first inverted digital signal, and third and fourth mutually coupled MOSFET drains for providing said second inverted digital signal.

15. A complementary MOSFET buffer circuit for receiving and buffering a digital signal, said complementary MOSFET buffer circuit comprising:

input-biased complementary MOSFET input inverter means for receiving and biasing an input digital signal, and for providing a first inverted digital signal, wherein said input-biased complementary MOSFET input inverter means includes a plurality of diode-connected MOSFETs, and first and second complementary MOSFETs which are mutually coupled in a totem-pole topology and have, respectively, a first MOSFET gate for receiving said input digital signal and a second MOSFET gate, first and second MOSFET sources, and mutually coupled first and second MOSFET drains for providing said first inverted digital signal, and wherein said plurality of diode-connected MOSFETs is coupled to said first and second MOSFET gates; and input-coupled complementary MOSFET output inverter means for receiving said first inverted digital signal and said input digital signal, and for providing a second inverted digital signal.

16. A digital signal buffering method for receiving and buffering a digital signal, comprising the steps of:
   receiving an input digital signal;
   biasing said input digital signal to provide a biased input digital signal;
   inputting said input digital signal and said biased input digital signal to a first complementary MOSFET inverter to provide a first inverted digital signal; and
   inputting said input digital signal and said first inverted digital signal to a second complementary MOSFET inverter to provide a second inverted digital signal.

17. A digital signal buffering method as recited in claim 16, wherein said step of inputting said input digital signal and said first inverted digital signal to a second complementary MOSFET inverter to provide a second inverted digital signal comprises:
   inputting said input digital signal to a MOSFET source;
   inputting said first inverted digital signal to mutually coupled third and fourth MOSFET gates; and
   outputting said second inverted digital signal from mutually coupled third and fourth MOSFET drains.

* * * * *